(12) United States Patent　　(10) Patent No.: US 7,134,042 B2
Shimasaki　　(45) Date of Patent: Nov. 7, 2006

(54) FREQUENCY DETECTION CIRCUIT AND DATA PROCESSING APPARATUS

(75) Inventor: Shinya Shimasaki, Kanagawa (JP)

(73) Assignee: NEC Electronics Corporation (JP)

( * ) Notice: Subject to any disclaimer, the term of this patent is extended or adjusted under 35 U.S.C. 154(b) by 504 days.

(21) Appl. No.: 10/744,788

(22) Filed: Dec. 22, 2003

(65) Prior Publication Data

US 2004/0177290 A1　Sep. 9, 2004

(30) Foreign Application Priority Data

Dec. 25, 2002　(JP) .............................. 2002-374756

(51) Int. Cl.
*G06F 11/00* (2006.01)
(52) U.S. Cl. .......................... 714/4; 327/47
(58) Field of Classification Search .................... 714/4, 714/34, 39; 327/47

See application file for complete search history.

(56) References Cited

U.S. PATENT DOCUMENTS 5,381,416 A * 1/1995 Vartti et al. ................. 714/700
5,657,361 A * 8/1997 Inagaki et al. ................ 377/39
6,333,646 B1 * 12/2001 Tsuzuki ....................... 327/47

OTHER PUBLICATIONS

English translation of relevant portions of Examiner's comments in Japanese Office Action issued Apr. 6, 2005 submitted in lieu of statement of relevancy of prior art to present invention.
English translation of relevant portions of Examiner's comments in Japanese Office Action issued Apr. 5, 2006 submitted in lieu of statement of relevancy of prior art to present invention.

* cited by examiner

*Primary Examiner*—Nadeem Iqbal
(74) *Attorney, Agent, or Firm*—Ostrolenk, Faber, Gerb & Soffen, LLP

(57) ABSTRACT

A frequency detection circuit according to the present invention has a status holding register for storing rise information and fall information about a check target clock and outputting an error detection signal showing frequency abnormality when information showing the next edge (a fall or a rise) from a rise or a fall of the check target clock is not stored, a rise/fall detection circuit for respectively detecting a rise and a fall of the check target clock and outputting a rise detection signal in response to the rise and a fall detection signal in response to the fall, a sampling clock generation circuit for generating sampling clock for storing the information about the check target clock, and an edge detection signal generation circuit for outputting an edge detection signal which is an edge detection result of the check target clock based on the rise detection signal and the fall detection signal.

10 Claims, 4 Drawing Sheets

FREQUENCY DETECTION CIRCUIT AND DATA PROCESSING APPARATUS

BACKGROUND OF THE INVENTION

1. Field of the Invention

The present invention relates to a frequency detection circuit which detects whether or not the frequency of a clock signal is lower than a predetermined frequency. This circuit outputs an error detection signal when the clock signal frequency is lower than the predetermined frequency. The present invention further relates to a data processing apparatus provided with such frequency detection circuit.

2. Description of the Prior Art

A data processing apparatus such as a microcomputer operates in synchronism with a clock signal, and this may malfunction when the frequency of the clock greatly deviates. Thus, such a frequency detection circuit as detecting whether or not the frequency of the clock is lower than a predetermined value is provided. The detection output is used to reset the operation of a CPU. The circuit having such function is disclosed in, for example, a Japanese laid-open Patent Publication 2002-55130.

The frequency detection circuit described in the publication, includes a capacitor C and a resistor R. The capacitor C is subjected to charging and discharging every time when the level of a clock changes. An error detection signal is outputted when the charge or discharge is not completed within one cycle of the clock.

However, the conventional frequency detection circuit uses the capacitor C and the resistor R, so that there is a problem that detection characteristics vary in accordance to a power supply voltage, an ambient temperature, variations in manufacture, etc. It is thus difficult to accurately determine whether or not a clock frequency is lower than a predetermined value.

Also, characteristics of analog elements constructing the data processing apparatus described above vary in accordance with use conditions such as an ambient temperature after shipment, so that there was a problem that detection characteristics of the frequency detection circuit vary.

Particularly, in the conventional data processing apparatus described above, there was a problem that when a frequency of a clock is lower than a predetermined frequency (that is, the predetermined frequency in which the data processing apparatus does not malfunction), its frequency abnormality cannot be detected.

SUMMARY OF THE INVENTION

A frequency detection circuit according to the present invention includes a rise/fall detection circuit for detecting a rise and a fall of a check target clock and outputting a rise detection signal in response to said rise and a fall detection signal in response to said fall, and a pulse width detection/error detection circuit for detecting a pulse width of a half cycle of the check target clock from said rise and fall detection signal, and outputting an error detection signal showing the frequency abnormality when the pulse width is longer than a predetermined time.

Also, a frequency detection circuit according to the present invention includes a status holding register for storing rise information showing a rise and fall information showing a fall of the check target clock and outputting an error detection signal showing the frequency abnormality when the fall information is not stored within a predetermined time from the rise of the check target clock or the rise information is not stored within a predetermined time from the fall of the check target clock, a rise/fall detection circuit for detecting a rise and a fall of the check target clock and outputting a rise detection signal in response to said rise and a fall detection signal in response to said fall, and an edge detection signal generation circuit for generating the rise information and the fall information with reference to the rise detection signal and the fall detection signal and outputting an edge detection signal including these information to the status holding register.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

A preferred embodiment of the present invention is described below in detail with reference to the accompanying drawings. The following description shows the embodiment of the present invention, and the present invention is not construed as limitation to the following description.

Figure 1:
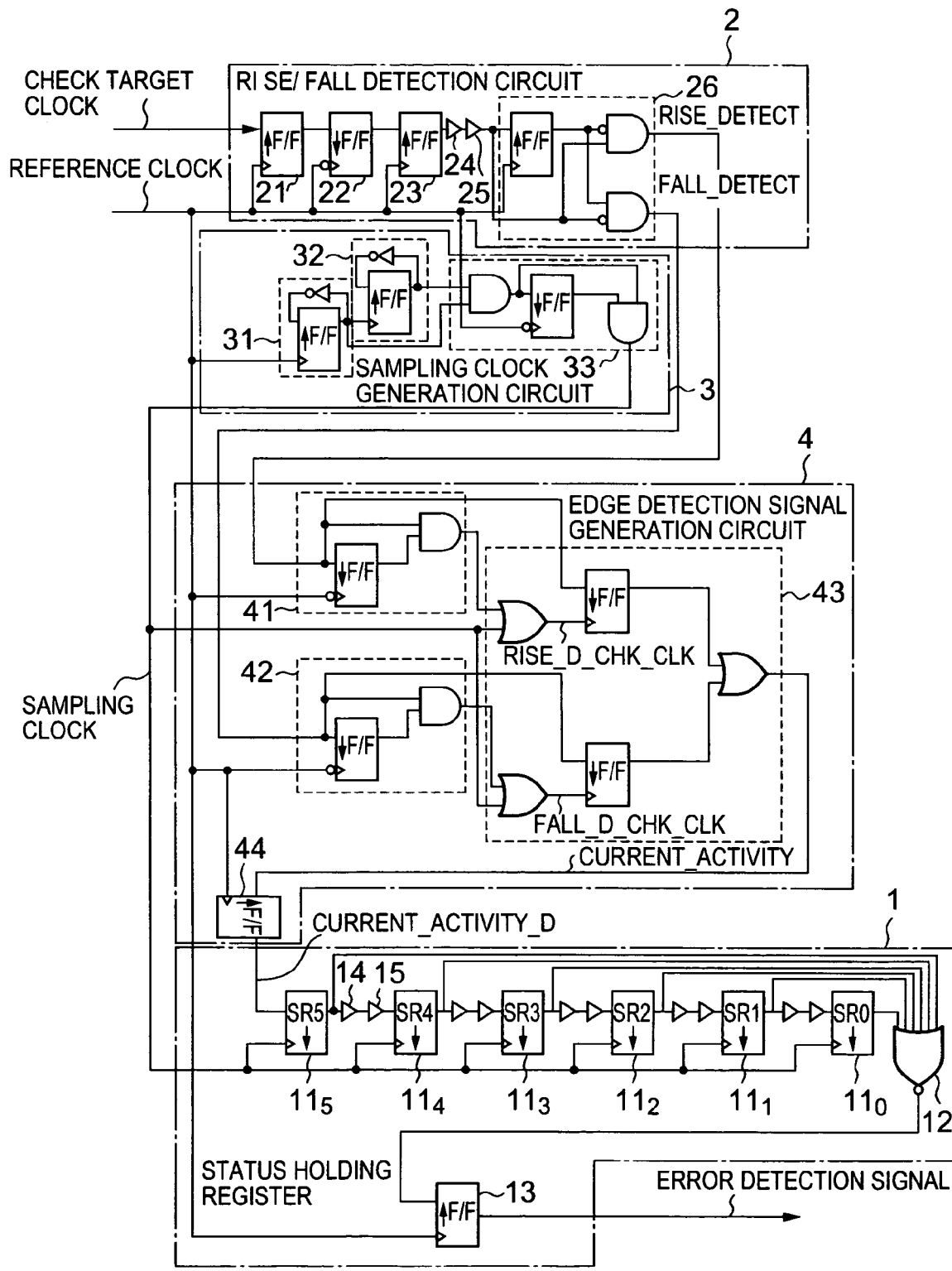
FIG. 1 is a circuit diagram showing one example of a frequency detection circuit of the present invention.

FIG. 1 is a circuit diagram showing one example of a frequency detection circuit constructing a data processing apparatus of the present invention.

A check target clock shown in FIG. 1 is, for example, a basic clock which is generated inside a semiconductor integrated circuit apparatus based on a clock supplied from the outside and is supplied to a CPU, a timer, memory, a control circuit, etc. when a data processing apparatus of the present embodiment is constructed of one semiconductor integrated circuit apparatus. Of course, the check target clock can be supplied from an outside the semiconductor integrated circuit apparatus. In one of the preferred embodiments, the reference clock is generated by a ring oscillator constructed on the semiconductor integrated circuit. Also, a reference clock shown in FIG. 1 is a clock, whose oscillation frequency is not influenced by a clock or a signal from the outside, outputted from an oscillation circuit independently included inside the data processing apparatus.

As shown in FIG. 1, a frequency detection circuit of the present embodiment is configured to have a status holding register 1 for storing a status (information about rise or fall) of a check target clock which is a clock of a frequency detection target and detecting frequency abnormality, a rise/fall detection circuit 2 for outputting a rise detection signal in response to a rise of the check target clock and outputting a fall detection signal in response to a fall, a sampling clock generation circuit 3 for generating sampling clock to store a status of the check target clock in the status holding register 1, and an edge detection signal generation circuit 4 for outputting an edge detection signal which is an edge detection result of the check target clock based on the rise detection signal and the fall detection signal.

The rise/fall detection circuit 2 is configured to have three flip-flops 21 to 23 which are connected in series and capture a value of the check target clock in synchronization with a rise or a fall of a reference clock, two buffer circuits 24, 25 for delaying an output of the flip-flop 23, and a pulse signal generation circuit 26 for outputting a rise detection signal (rise$_{13}$ detect) which is a pulse signal of one cycle width of the reference clock at the time of rise detection of the check target clock and outputting a fall detection signal (fall$_{13}$ detect) which is a pulse signal of one cycle width of the reference clock at the time of fall detection of the check target clock.

The sampling clock generation circuit 3 is configured to have a frequency division circuit 31 for dividing the reference clock into half, a frequency division circuit 32 for dividing an output signal of the frequency division circuit 31 into half, and a pulse signal generation circuit 33 for outputting a sampling clock made of a pulse signal of a half cycle width of the reference clock based on an output of the frequency division circuit 32. Here, in the present embodiment, a configuration in which a cycle of the sampling clock is set to four times the reference clock is shown, but the cycle of the sampling clock is not limited to this and may be set to the cycle two times or eight times, generally n (where n is an integer of two or more) times.

The edge detection signal generation circuit 4 is configured to have a rise edge detection circuit 41 for detecting a status of "1" of the rise detection signal in synchronization with a fall of the reference clock, a fall edge detection circuit 42 for detecting a status of "1" of the fall detection signal in synchronization with a fall of the reference clock, an OR circuit 43 for outputting an edge detection signal (current_activity) based on detection results outputted from the rise edge detection circuit 41 and the fall edge detection circuit 42 and a fall of the sampling clock, and a delay circuit 44 for delaying the edge detection signal outputted from the OR circuit 43 by a half cycle of the reference clock. The edge detection signal is thus confirmed in a status of "1" at the time of a rise of the sampling clock when a rise or a fall of the check target clock is detected, so that the status holding register 1 can surely capture a status of the check target clock.

As shown in FIG. 1, the status holding register 1 is configured to have shift registers 11$_0$ to 11$_5$ which capture an edge detection signal (current_activity_d) outputted from the delay circuit 44 in synchronization with the sampling clock and are connected in series and perform a one-bit shift, a NOR circuit 12 for outputting NOR of output signals of the shift registers 11$_0$ to 11$_5$, and a synchronous circuit 13 for outputting an output signal of the NOR circuit 12 as an error detection signal in synchronization with the reference clock.

Incidentally, a configuration in which two buffer circuits 14, 15 for delaying a signal are respectively inserted between each of the shift registers 11$_0$ to 11$_5$ is shown in FIG. 1. Also, a configuration in which the six shift registers 11$_0$ to 11$_5$ are equipped in the status holding register 1 is shown in FIG. 1, and the number of shift registers determines a criterion of frequency abnormality of the check target clock. For example, in the case of six shift registers, the error detection signal is outputted when a half cycle (a width from a rise to a fall or a width from a fall to a rise) of the check target clock is more than or equal to (one cycle of the reference clock×4, that is, one cycle of the sampling clock in the circuit of FIG. 1)×6 (the number of shift registers). Similarly, in order to be constructed so that the error detection signal is outputted when the half cycle is more than or equal to (one cycle of the reference clock×4, that is, one cycle of the sampling clock in the circuit of FIG. 1) times m (where m is an integer of two or more), the number of shift registers connected in series is set to m.

Next, an operation of the frequency detection circuit of the present invention is described with reference to FIGS. 2 and 3.

Figure 2:
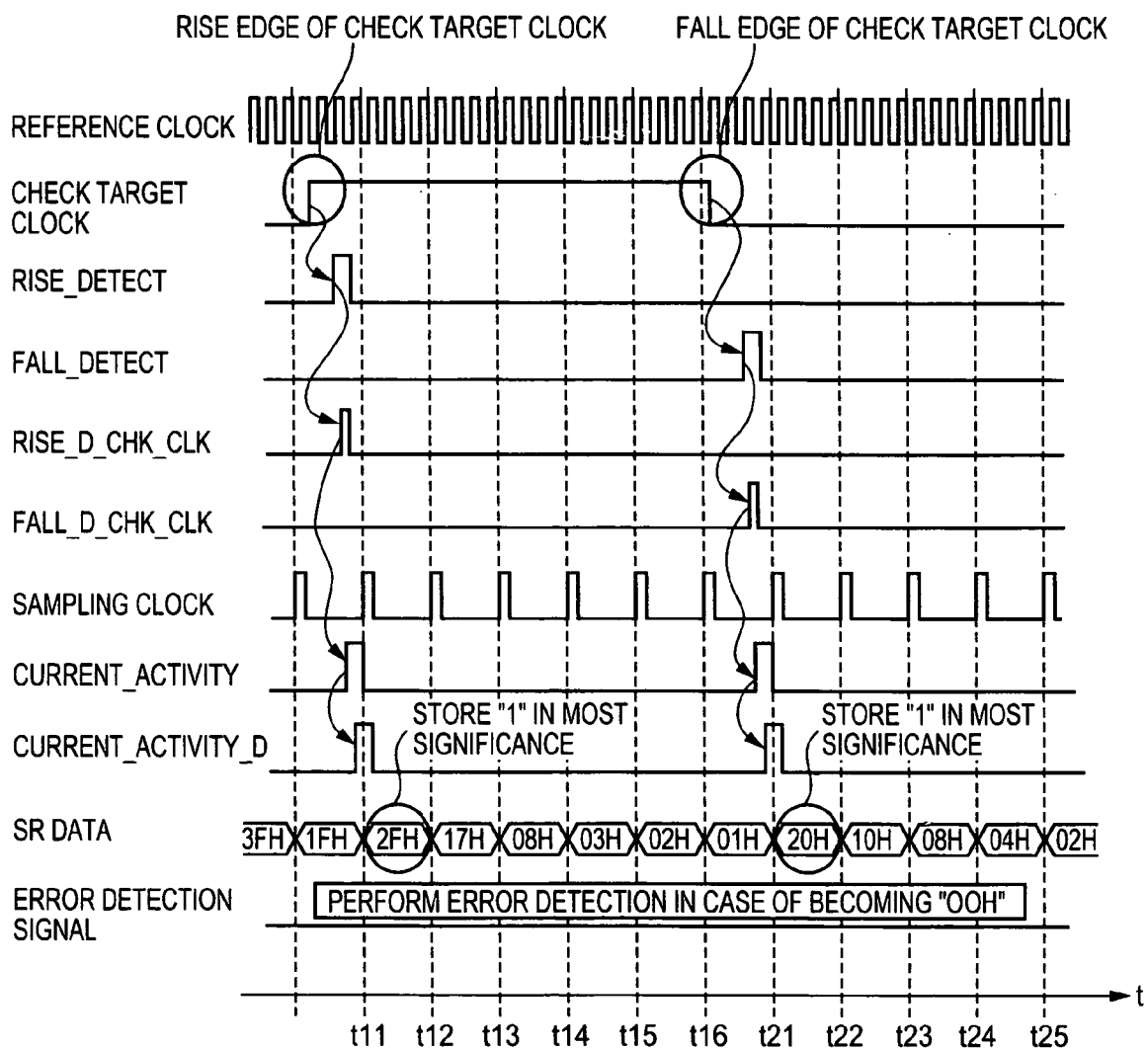
FIG. 2 is a timing chart showing an operation at the time of normalcy of the frequency detection circuit shown in FIG. 1.
Figure 3:
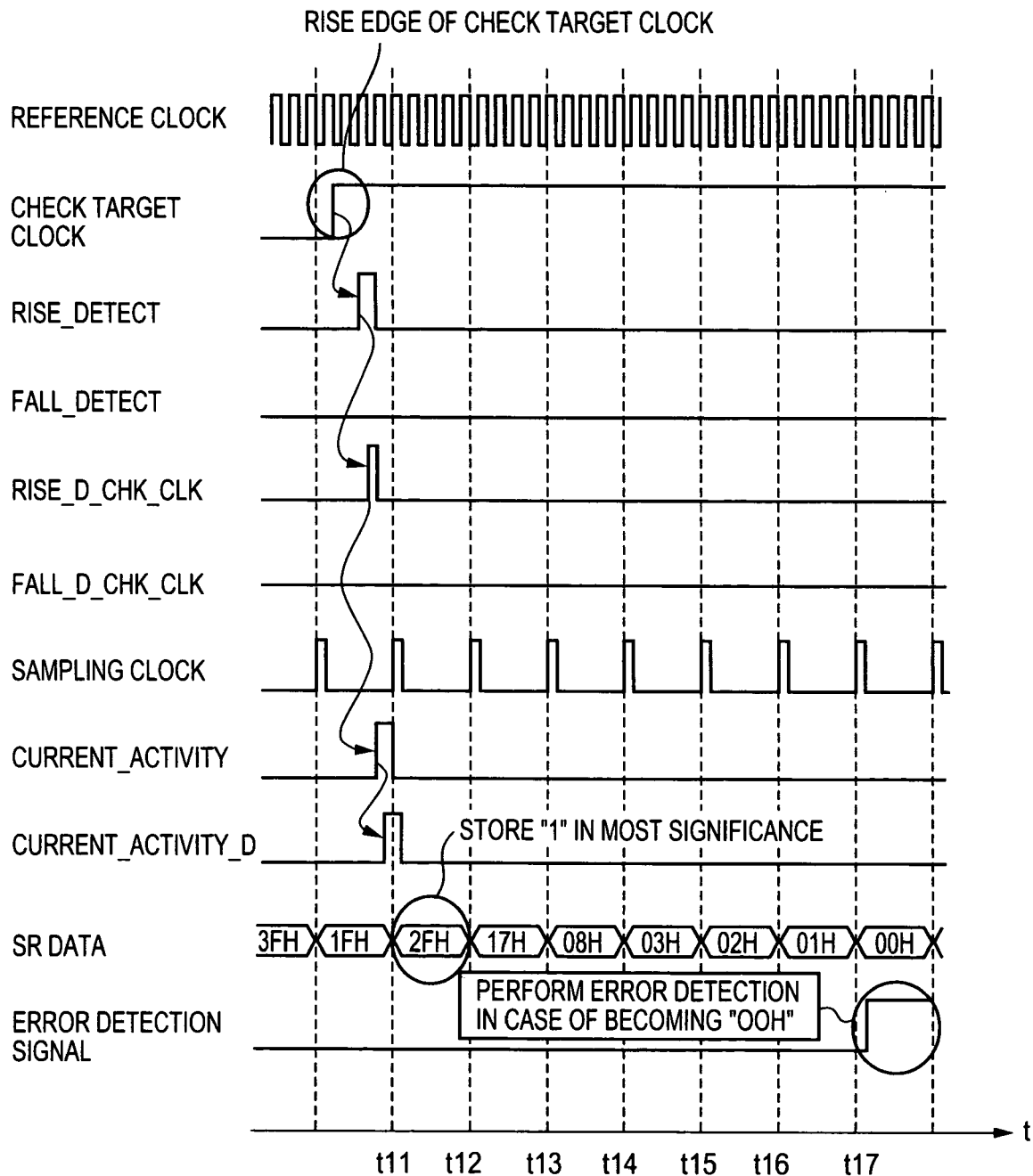
FIG. 3 is a timing chart showing an operation at the time of error detection of the frequency detection circuit shown in FIG. 1.

FIG. 2 is a timing chart showing an operation at the normal time of the frequency detection circuit shown in FIG. 1, and FIG. 3 is a timing chart showing an operation at the time of error detection of the frequency detection circuit shown in FIG. 1.

As shown in FIG. 2, when a frequency of a check target clock is in a normal range, a rise detection signal (rise_detect) is outputted from the rise/fall detection circuit 2 in response to a rise of the check target clock and a fall detection signal (fall_detect) is outputted in response to a fall of the check target clock.

The edge detection signal generation circuit 4 generates a signal (rise_d_ch_clk) showing a status of "1" of a rise detection signal in synchronization with a fall of a reference clock based on the rise detection signal (rise_detect) outputted from the rise/fail detection circuit 2, and outputs an edge detection signal (current_activity) made of a pulse width from a rise of this signal to a rise of a sampling clock.

Also, a signal (fall_d_chk_clk) showing a status of "1" of a fall detection signal is generated in synchronization with a fall of the reference clock based on the fall detection signal (fall_detect) outputted from the rise/fall detection circuit 2, and an edge detection signal (current_activity) made of a pulse width from a rise of this signal to a rise of a sampling clock is outputted. The edge detection signal is delayed by a half cycle of the reference clock through the delay circuit 44 and thereafter is supplied to the status holding register 1 as a signal (current_activity_d).

The status holding register 1 captures the edge detection signal (current_activity_d) by the most significant shift register (SR5 of FIG. 1) 11$_5$ in synchronization with a rise of the sampling clock, and sequentially transfers data to the shift register of the next step at every sampling clock.

That is, at the time t11, the most significant shift register (SR5) 11$_5$ captures "1" and a status of the shift registers of six bits made of the least significant shift register (SR0) 11$_0$ to the most significant shift register (SR5) 11$_5$ becomes "2FH".

Next, at the time t12, in synchronization with a rise of the sampling clock, "1" stored in the shift register (SR5) 11$_5$ is shifted to the right by one bit and a status of the shift registers of six bits becomes "17H". Thus, "1" is sequentially shifted in the right direction (lower direction) and the status becomes "01H" at the time t16.

Then, when outputs of all the shift registers 11$_0$ to 11$_5$ become "0", that is, data (SR data) of the shift registers 11$_0$ to 11$_5$ become "00H", "1" is outputted from the NOR circuit 12. In FIG. 2, before the outputs of all the shift registers 11$_0$ to 11$_5$ become "0", a fall detection signal (fall_detect) is outputted from the rise/fall detection circuit 2 and an edge detection signal (current_activity_d) is supplied from the edge detection signal generation circuit 4, so that an output of the NOR circuit 12 is maintained at "0".

Therefore, according to a configuration of the frequency detection circuit of the present embodiment, when a half cycle of the check target clock is a predetermined time width or less, an error detection signal is not outputted and a data processing apparatus in which the frequency detection circuit of the present invention is mounted normally operates.

On the other hand, as shown in FIG. 3, when a width of the half cycle of the check target clock becomes the predetermined time width or more, only a rise detection signal (rise_detect) in response to a rise of the check target clock is outputted from the rise/fall detection circuit 2 within a predetermined time.

The edge detection signal generation circuit 4 generates a signal (rise_d_chk_clk) showing a status of "1" of a rise detection signal in synchronization with a fall of a reference clock based on the rise detection signal (rise_detect) outputted from the rise/fall detection circuit 2, and outputs an edge detection signal (current_activity) made of a pulse width from a rise of the signal (rise_d_chk_clk) to a rise of a sampling clock.

Here, since a fall detection signal (fall_detect) is not outputted from the rise/fall detection circuit 2, only an edge detection signal (current_activity_d) in response to a rise of the check target clock is supplied to the status holding register 1.

The status holding register 1 captures the edge detection signal (current_activity_d) outputted from the delay circuit 44 by the most significant shift register (SR5 of FIG. 1) in synchronization with a rise of the sampling clock, and sequentially transfers data to the shift register of the next step at every sampling clock.

In an example of FIG. 3, the edge detection signal in response to a fall of the check target clock is not supplied within a predetermined time (6 sampling clocks), so that a status in which outputs of all the shift registers $11_0$ to $11_5$ become "0", that is, a status in which data (SR data) of the shift registers $11_0$ to $11_5$ become "00H" occurs and at this time, "1" is outputted from the NOR circuit 12. When "1" is outputted from the NOR circuit 12, the synchronous circuit 13 outputs "1" as an error detection signal in synchronization with the reference clock.

In the above description, an example for determining abnormality of a frequency by whether or not a time width from a rise to a fall of the check target clock is within a predetermined time has been shown, but the circuit shown in FIG. 1 also determines abnormality of a frequency by whether or not a time width from a fall to a rise of the check target clock is within a predetermined time. That is, since a duty ratio of the check target clock is not 50%, even when abnormality is not detected by the width from a rise to a fall of the check target clock, abnormality is detected by the width from the next fall to a rise of the check target clock in the case that a frequency of the check target clock is low.

Thus, the frequency detection circuit of the present embodiment outputs an error detection signal when a frequency of the check target clock is less than or equal to a predetermined frequency (here, ⅛ of the frequency of the reference clock).

In other words, the error detection signal is outputted when a half cycle (a width from a rise to a fall or a width from a fall to a rise) of the check target clock is more than or equal to (one cycle of the reference clock×4) times 6 (the number of shift registers).

As described above, according to the frequency detection circuit of the present embodiment, a rise and a fall of the check target clock are respectively detected by the rise/fall detection circuit 2 and an error detection signal is outputted when information showing a fall constructing an edge detection signal is not stored with respect to the status holding register 1 within a predetermined time from the rise of the check target clock or information showing a rise constructing the edge detection signal is not stored within a predetermined time from the fall of the check target clock, so that the error detection signal is outputted from the frequency detection circuit when a time width of a half cycle of the check target clock is longer than a predetermined value.

Therefore, when a frequency of the check target clock is lower than a predetermined frequency, its frequency abnormality can be stably detected.

In the above description, an example of a frequency detection circuit of the present invention comprising a rise/fall detection circuit, an edge detection signal generation circuit and a status holding register has been shown, but instead of an edge detection signal generation circuit and a status holding register, the frequency detection circuit of the present invention is able to use a pulse width detection/error detection circuit for detecting a pulse width of a half cycle of the check target clock, and outputting an error detection signal showing the frequency abnormality when the pulse width is longer than a predetermined time.

Figure 4:
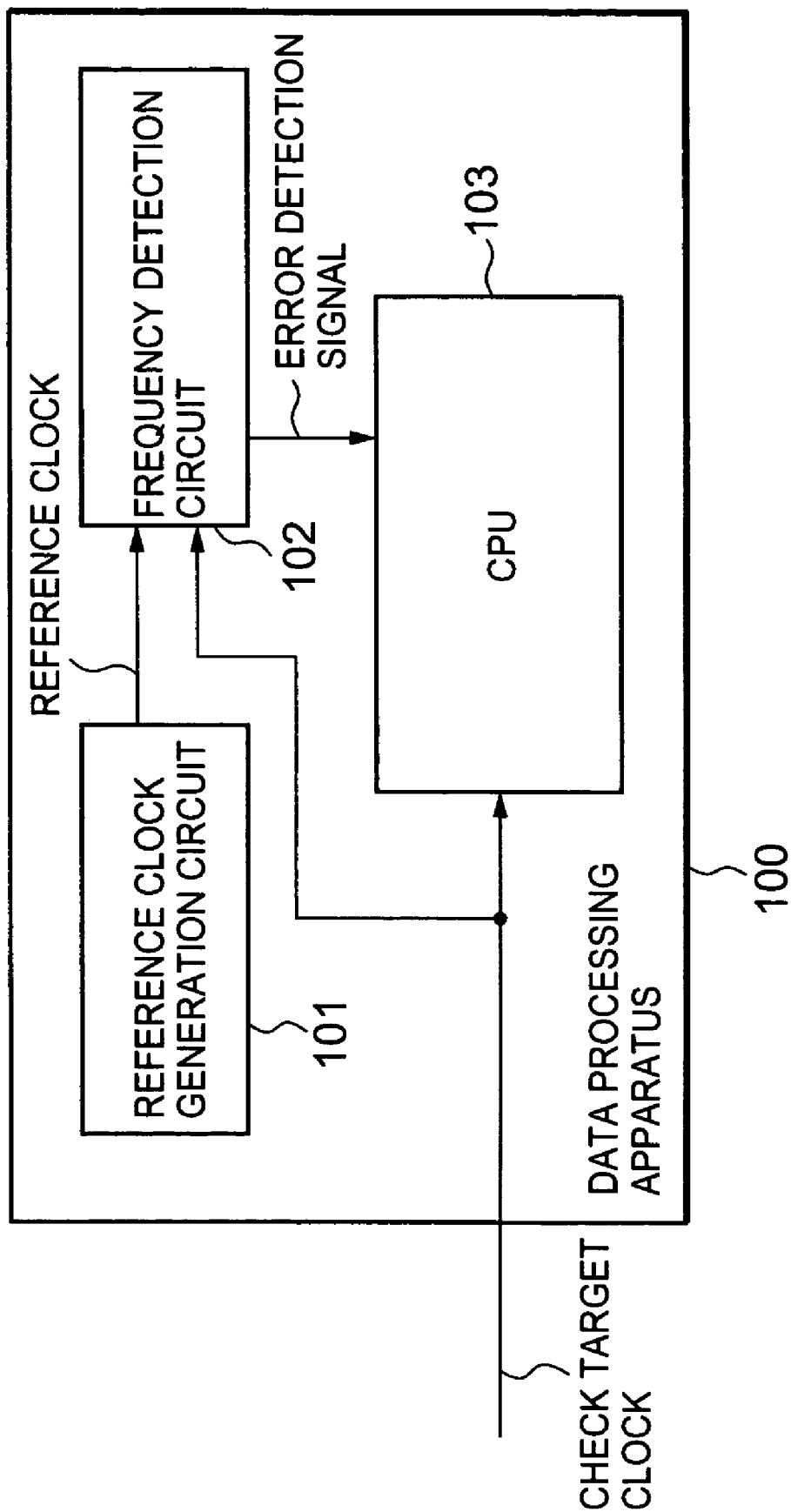
FIG. 4 is a block diagram showing a data processing apparatus in which the frequency detection circuit of the present invention is mounted.

Next, a data processing apparatus 100 using the frequency detection circuit of the present invention is described with reference to FIG. 4. In FIG. 4, the data processing apparatus 100 has a reference clock generation circuit 101 for outputting a reference clock, a frequency detection circuit 102 according to the present invention shown in FIG. 1 and a CPU 103 operated in synchronization with a check target clock. The reference clock generation circuit is configured to have a ring oscillator (not shown) which is constructed with inverters. As is evident from the above description, a reference clock is generated inside the data processing apparatus, so that a frequency of the reference clock is not influenced by external conditions (external power supply voltage, external signals or external clock, etc). The frequency detection circuit 102 inputs the check target clock supplied from an outside and the reference clock generated inside the data processing apparatus and outputs an error detection signal for resetting an operation of CPU 103 when a time width of a half cycle of the check target clock is longer than a predetermined time. The CPU is reset by the error detection signal, so that malfunction is prevented when a frequency of the check target clock supplied from the outside deviates greatly.

In the above, the case of resetting the CPU 103 by an error detection signal outputted from the frequency detection circuit 102 has been described, but similar effect can be also obtained in the case of being constructed so as to reset another signal processing circuit such as a DSP (Digital Signal Processor) by receiving the error detection signal.

As is evident from the above description, according to the present invention, in the frequency detection circuit of the present invention, a rise and a fall of a check target clock are respectively detected by a rise/fall detection circuit and an error detection signal is outputted when information showing a fall is not stored with respect to a status holding register within a predetermined time from the rise of the check target clock or information showing a rise is not stored within a predetermined time from the fall of the check target clock, so that the error detection signal is outputted from the frequency detection circuit when a time width of a half cycle of the check target clock is longer than a predetermined time. Therefore, when a frequency of the check target clock is lower than a predetermined frequency, its frequency abnormality can be stably detected.

Also, in the data processing apparatus of the present invention, when an error detection signal is outputted from the frequency detection circuit described above, an operation of a signal processing circuit such as a CPU is reset by the error detection signal, so that a malfunction is prevented.

What is claimed is:

1. A frequency detection circuit for detecting frequency abnormality of a check target clock, comprising:
   a rise/fall detection circuit for detecting a rise and a fall of the check target clock and outputting a rise detection signal in response to said rise and a fall detection signal in response to said fall, and
   a pulse width detection/error detection circuit for detecting a pulse width of a half cycle of the check target clock from said rise and fall detection signal, and outputting an error detection signal showing the frequency abnormality when said pulse width is longer than a predetermined time.

2. A frequency detection circuit for detecting frequency abnormality of a check target clock, comprising:
   a status holding register for storing rise information showing a rise and fall information showing a fall of the check target clock and outputting an error detection signal showing the frequency abnormality when the fall information is not stored within a predetermined time from the rise of the check target clock or the rise information is not stored within a predetermined time from the fall of the check target clock,
   a rise/fall detection circuit for detecting a rise and a fall of the check target clock and outputting a rise detection signal in response to said rise and a fall detection signal in response to said fall, and
   an edge detection signal generation circuit for generating the rise information and the fall information with reference to the rise detection signal and the fall detection signal and outputting an edge detection signal including these information to the status holding register.

3. A frequency detection circuit as defined in claim 2, comprising a sampling clock generation circuit for generating a sampling clock for storing the rise information and the fall information about the check target clock in the status holding register in synchronization with the sampling clock.

4. A frequency detection circuit as defined in claim 2, comprising a delay circuit for delaying the edge detection signal and outputting the edge detection signal to the status holding register.

5. A frequency detection circuit as defined in claim 2, wherein the status holding register has plural shift registers which capture an edge detection signal outputted from the edge detection signal generation circuit in synchronization with the sampling clock and sequentially transfer data to the next step at every said sampling clock and are connected in series, and a NOR circuit for outputting NOR of output signals of each of the shift registers.

6. A frequency detection circuit as defined in claim 5, wherein the number of steps of the shift registers is set to the maximum number of the sampling clock included within the predetermined time.

7. A frequency detection circuit as defined in claim 5, wherein a delay circuit for delaying a signal is provided between each of the shift registers.

8. A frequency detection circuit as defined in claim 2, wherein the edge detection signal generation circuit generates a width from a change point of a reference clock in an activation period of the rise detection signal to a change point of the sampling clock and a width from a change point of a reference clock in an activation period of the fall detection signal to a change point of the sampling clock as a pulse width of the edge detection signal, respectively.

9. A data processing apparatus comprising:
   a reference clock generation circuit for outputting a reference clock,
   a frequency detection circuit for inputting a check target clock supplied from an outside and the reference clock and outputting an error detection signal when a time width of a half cycle of the check target clock is longer than a predetermined time,
   a signal processing circuit being reset in the case of receiving the error detection signal outputted from the frequency detection circuit.

10. A data processing apparatus as defined in claim 8, wherein the frequency detection circuit for detecting frequency abnormality of a check target clock, comprising:
    a status holding register for storing rise information showing a rise and fall information showing a fall of the check target clock and outputting an error detection signal showing the frequency abnormality when the fall information is not stored within a predetermined time from the rise of the check target clock or the rise information is not stored within a predetermined time from the fall of the check target clock,
    a rise/fall detection circuit for detecting a rise and a fall of the check target clock and outputting a rise detection signal in response to said rise and a fall detection signal in response to said fall, and
    an edge detection signal generation circuit for generating the rise information and the fall information with reference to the rise detection signal and the fall detection signal and outputting an edge detection signal including these information to the status holding register.

* * * * *